United States Patent
Yabe et al.

(10) Patent No.: US 11,781,219 B2
(45) Date of Patent: Oct. 10, 2023

(54) PROCESSING APPARATUS AND PROCESSING METHOD

(71) Applicant: TOKYO ELECTRON LIMITED, Tokyo (JP)

(72) Inventors: Kazuo Yabe, Nirasaki (JP); Kazumasa Igarashi, Nirasaki (JP); Yamato Tonegawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 339 days.

(21) Appl. No.: 16/819,484

(22) Filed: Mar. 16, 2020

(65) Prior Publication Data
US 2020/0299839 A1    Sep. 24, 2020

(30) Foreign Application Priority Data
Mar. 22, 2019   (JP) ................ 2019-055372

(51) Int. Cl.
*C23C 16/455* (2006.01)
*C23C 16/34* (2006.01)
*C23C 16/36* (2006.01)
*C23C 16/30* (2006.01)

(52) U.S. Cl.
CPC ...... *C23C 16/45536* (2013.01); *C23C 16/308* (2013.01); *C23C 16/345* (2013.01); *C23C 16/36* (2013.01); *C23C 16/45534* (2013.01); *C23C 16/45542* (2013.01); *C23C 16/45546* (2013.01); *C23C 16/45553* (2013.01)

(58) Field of Classification Search
None
See application file for complete search history.

(56) References Cited

U.S. PATENT DOCUMENTS

| | | | | |
|---|---|---|---|---|
| 7,625,609 B2* | 12/2009 | Matsuura | .......... | C23C 16/45546 427/255.393 |
| 10,388,511 B2* | 8/2019 | Tonegawa | .......... | C23C 16/45574 |
| 2006/0213444 A1* | 9/2006 | Samukawa | .......... | C23C 16/452 118/723 R |
| 2006/0216481 A1* | 9/2006 | Suzuki | .......... | B27M 1/02 264/339 |
| 2014/0099794 A1* | 4/2014 | Ingle | .......... | H01L 21/67069 156/345.35 |
| 2015/0118394 A1* | 4/2015 | Varadarajan | .......... | C23C 16/36 427/249.15 |
| 2015/0275368 A1* | 10/2015 | Motoyama | .......... | C23C 16/45546 118/728 |
| 2016/0365246 A1* | 12/2016 | Yamamoto | .......... | C23C 16/45546 |
| 2018/0342385 A1* | 11/2018 | Tonegawa | .......... | C23C 16/45534 |

FOREIGN PATENT DOCUMENTS

JP    2015-532016 A    11/2015
JP      2018-11009 A     1/2018

* cited by examiner

*Primary Examiner* — Jose I Hernandez-Kenney
(74) *Attorney, Agent, or Firm* — Nath, Goldberg & Meyer; Jerald L. Meyer; Tanya E. Harkins (57) ABSTRACT

A processing apparatus includes a processing container accommodating a substrate therein, a plasma generator having a plasma generation space communicating with an inside of the processing container, a first gas supply provided in the plasma generation space and configured to supply a hydrogen gas, and a second gas supply provided in the processing container and configured to supply a hydrogen gas.

5 Claims, 6 Drawing Sheets

PROCESSING APPARATUS AND PROCESSING METHOD

CROSS-REFERENCE TO RELATED APPLICATION

This application is based upon and claims the benefit of priority from Japanese Patent Application No. 2019-055372, filed on Mar. 22, 2019, the entire contents of which are incorporated herein by reference.

TECHNICAL FIELD

The present disclosure relates to a processing apparatus and a processing method.

BACKGROUND

There is known a technology for performing a step of purging hydrogen radicals by generating hydrogen radicals in a processing container between a step of adsorbing a film forming raw material and a step of nitriding the film forming raw material in each cycle when forming a nitride film through an ALD method (see e.g., Patent Document 1).

PRIOR ART DOCUMENT

Patent Document

Patent Document 1: Japanese Laid-Open Patent Publication No. 2018-11009

SUMMARY

According to embodiments of the present disclosure, there is provided a processing apparatus that includes a processing container accommodating a substrate therein, a plasma generator having a plasma generation space communicating with inside of the processing container, a first gas supply provided in the plasma generation space and configured to supply a hydrogen gas, and a second gas supply provided in the processing container and configured to supply a hydrogen gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations will be omitted.

[Processing Apparatus]

Figure 1:
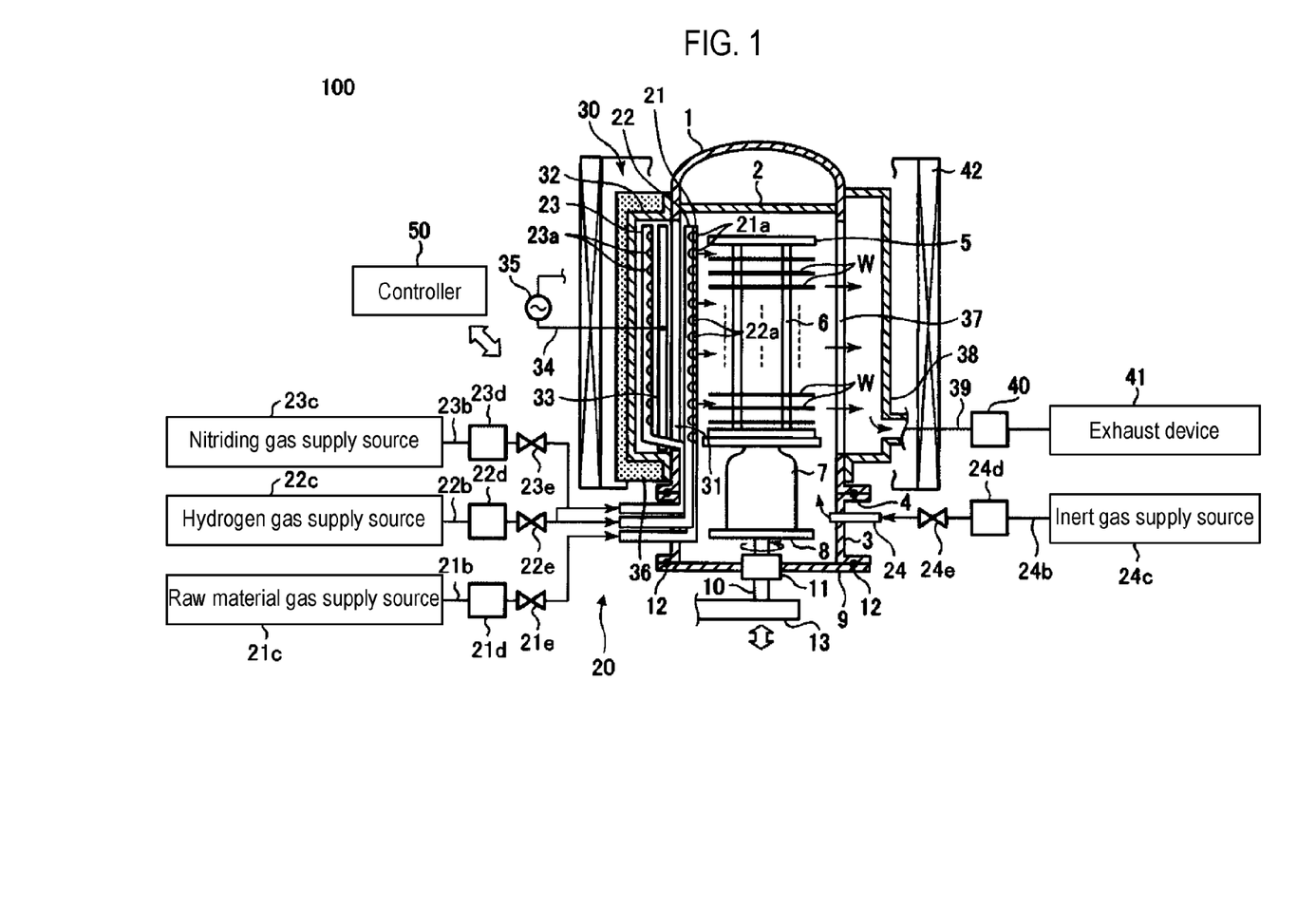
FIG. 1 is a view illustrating a configuration example of a processing apparatus according to an embodiment.
Figure 2:
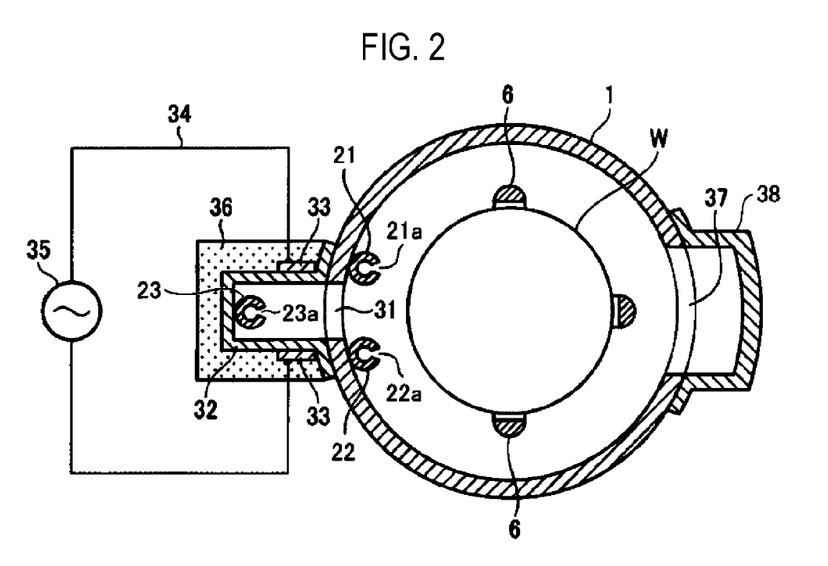
FIG. 2 is a view for explaining a processing container and a plasma generator of the processing apparatus of FIG. 1.

A processing apparatus according to an embodiment will be described. FIG. 1 is a view illustrating a configuration example of a processing apparatus according to an embodiment. FIG. 2 is a view for explaining a processing container and a plasma generator of the processing apparatus of FIG. 1.

The processing apparatus 100 includes a cylindrical processing container 1 having a ceiling and an opened lower end. The entire processing container 1 is made of, for example, quartz. In the vicinity of an upper end in the processing container 1, a ceiling plate 2 formed of quartz is provided, and the area below the ceiling plate 2 is sealed. A metal manifold 3 formed in a cylindrical shape is connected to the opening at the lower end of the processing container 1 via a seal member 4 such as an O-ring.

The manifold 3 supports a lower end of the processing container 1 and a wafer boat 5, in which a large number of (e.g., 25 to 150) semiconductor wafers (hereinafter, referred to as "wafers W") as substrates are placed in multiple stages, is inserted into the processing container 1 from below the manifold 3. The wafer boat 5 is formed of, for example, quartz. The wafer boat 5 has three rods 6 (see FIG. 2), and the large number of wafers W are supported by grooves (not illustrated) formed in the rods 6.

The wafer boat 5 is placed on a table 8 via a heat insulating tube 7 formed of quartz. The table 8 is supported on a rotation shaft 10 that penetrates a metal (stainless) lid 9 configured to open/close an opening at the lower end of the manifold 3.

A magnetic fluid seal 11 is provided in the penetrating portion of the rotation shaft 10 so as to rotatably support the rotation shaft 10 while hermetically sealing the rotation shaft 10. Between the peripheral portion of the lid 9 and the lower end of the manifold 3, there is provided a seal member 12 configured to maintain a sealing property in the processing container 1.

The rotation shaft 10 is attached to a tip end of an arm 13 supported, for example, by an elevating mechanism (not illustrated) such as a boat elevator, and the wafer boat 5 and the lid 9 are integrally moved up and down to be inserted into and removed from the processing container 1. In addition, the table 8 may be fixedly provided near the lid 9, so that processing of the wafers W may be performed without rotating the wafer boat 5.

The processing apparatus 100 also includes a gas supply 20 configured to supply a predetermined gas such as a processing gas or a purge gas into the processing container 1.

The gas supply 20 has a plurality (e.g., four) of gas supply pipes 21, 22, 23, and 24. The gas supply pipes 21, 22, and 23 are formed of, for example, quartz. The gas supply pipes 21, 22, and 23 penetrate inward through the side wall of the manifold 3, and are bent upward to extend vertically. A plurality of gas holes 21a, 22a, and 23a are formed at predetermined intervals in a vertical portion of each of the gas supply pipes 21, 22, and 23 over a vertical length corresponding to a wafer support range of the wafer boat 5. Each of the gas holes 21a, 22a, and 23a ejects gas in a horizontal direction. The gas supply pipe 24 is formed of, for example, quartz, and is formed of a short quartz pipe provided through the side wall of the manifold 3.

The vertical portion of the gas supply pipe 21 is provided in the processing container 1. A gas containing a film forming raw material (hereinafter, referred to as a "raw material gas") is supplied to the gas supply pipe 21 from a material gas supply source 21c through a gas pipe 21b. The gas pipe 21b is provided with a flow rate controller 21d and an opening/closing valve 21e. As a result, the raw material gas from the raw material gas supply source 21c is supplied into the processing container 1 through the gas pipe 21b and the gas supply pipe 21. As the raw material gas, for example, a silicon (Si) compound containing chlorine (Cl) such as dichlorosilane (DCS; $SiH_2Cl_2$), monochlorosilane (MCS; $SiH_3Cl$), trichlorosilane (TCS; $SiHCl_3$), silicon tetrachloride (STC; $SiCl_4$), and hexachlorodisilane (HCD; $Si_2Cl_6$) may be used.

The vertical portion of the gas supply pipe 22 is provided in the processing container 1. Hydrogen ($H_2$) gas is supplied to the gas supply pipe 22 from a hydrogen gas supply source 22c through a gas pipe 22b. The gas pipe 22b is provided with a flow rate controller 22d and an opening/closing valve 22e. As a result, the $H_2$ gas from the hydrogen gas supply source 22c is supplied into the processing container 1 through the gas pipe 22b and the gas supply pipe 22.

The vertical portion of the gas supply pipe 23 is provided in a plasma generation space to be described later. Hydrogen ($H_2$) gas is supplied to the gas supply pipe 23 from the hydrogen gas supply source 22c through the gas pipe 22b. In addition, the gas supply pipe 23 is supplied with a nitriding gas from a nitriding gas supply source 23c through a gas pipe 23b. The gas pipes 22b and 23b are provided with flow rate controllers 22d and 23d and opening/closing valves 22e and 23e, respectively. As a result, the $H_2$ gas from the hydrogen gas supply source 22c is supplied to the plasma generation space through the gas pipe 22b and the gas supply pipe 23, converted into plasma in the plasma generation space, and supplied into the processing container 1. Further, the nitriding gas from the nitriding gas supply source 23c is supplied to the plasma generation space through the gas pipe 23b and the gas supply pipe 23, converted into plasma in the plasma generation space, and supplied into the processing container 1. As the nitriding gas, for example, an organic hydrazine compound such as ammonia ($NH_3$), nitrogen ($N_2$), diazene ($N_2H_2$), hydrazine ($N_2H_4$), or monomethylhydrazine ($CH_3(NH)NH_2$) may be used.

The gas supply pipe 24 is supplied with an inert gas from an inert gas supply source 24c through a gas pipe 24b. The gas pipe 24b is provided with a flow rate controller 24d and an opening/closing valve 24e. As a result, the inert gas from the inert gas supply source 24c is supplied into the processing container 1 through the gas pipe 24b and the gas supply pipe 24. As the inert gas, for example, argon (Ar) or nitrogen ($N_2$) may be used. Although the case in which an inert gas is supplied from the inert gas supply source 24c into the processing container 1 through the gas pipe 24b and the gas supply pipe 24 has been described, the present disclosure is not limited thereto. The inert gas may be supplied from any of the gas supply pipes 21, 22, and 23.

A plasma generator 30 is formed on a part of the side wall of the processing container 1. The plasma generator 30 converts the nitriding gas into plasma so as to generate active species for nitriding, and further converts the $H_2$ gas into plasma so as to generate hydrogen (H) radicals.

The plasma generator 30 includes a plasma partition wall 32 that is hermetically welded to the outer wall of the processing container 1. The plasma partition wall 32 is formed of, for example, quartz. The plasma partition wall 32 has a concave cross section and covers an opening 31 formed in the side wall of the processing container 1. The opening 31 is elongated in the vertical direction so as to cover all the wafers W supported by the wafer boat 5 in the vertical direction. The gas supply pipe 23 for ejecting the above-described nitriding gas and $H_2$ gas is disposed in an inner space, which is defined by the plasma partition wall 32 and in communication with the inside of the processing container 1, that is, the plasma generation space. The gas supply pipe 21 for ejecting the raw material gas and the gas supply pipe 22 for ejecting the $H_2$ gas are provided at positions near the wafers W along the inner wall of the processing container 1 outside the plasma generation space. FIG. 2 illustrates an example in which the gas supply pipe 21 and the gas supply pipe 22 are arranged with the opening 31 interposed therebetween, but the present disclosure is not limited thereto. In addition, each of the gas supply pipes may be arranged as a plurality of gas supply pipes.

In addition, the plasma generator 30 further includes a pair of plasma electrodes 33 and a high-frequency power supply 35. The pair of plasma electrodes 33 has an elongated shape, and is disposed on the outer surfaces of the walls on both sides of the plasma partition wall 32 so as to face each other in the vertical direction. The high-frequency power supply 35 is connected to each of the pair of plasma electrodes 33 via a power supply line 34, and supplies a high-frequency power of, for example, 13.56 MHz to the pair of plasma electrodes 33. As a result, a high-frequency electric field is applied to the inside of the plasma generation space defined by the plasma partition wall 32. The nitriding gas and the $H_2$ gas ejected from the gas supply pipe 23 are converted into plasma in the plasma generation space to which the high-frequency electric field is applied, and active species for nitriding and hydrogen radicals generated by the plasma are supplied to the inside of the processing container 1 through the opening 31.

An insulating protection cover 36 is installed outside the plasma partition wall 32 so as to cover the plasma partition wall 32. A coolant passage (not illustrated) is provided inside the insulating protection cover 36, and the plasma electrodes 33 are cooled by causing the cooled coolant such as nitrogen ($N_2$) gas to flow into the coolant passage.

An exhaust port 37 for evacuating the inside of the processing container 1 is provided in a side wall portion of the processing container 1 that faces the opening 31. The exhaust port 37 is formed in a vertically elongated shape corresponding to the wafer boat 5. In a portion corresponding to the exhaust port 37 of the processing container 1, an exhaust port cover member 38, which is formed in a U shape in cross section, is provided so as to cover the exhaust port 37. The exhaust port cover member 38 extends upward along the side wall of the processing container 1. An exhaust pipe 39 for evacuating the processing container 1 through the exhaust port 37 is connected to a lower portion of the exhaust port cover member 38. A pressure control valve 40 configured to control the pressure inside the processing container 1 and an exhaust device 41 including a vacuum pump and the like are connected to the exhaust pipe 39, and the inside of the processing container 1 is evacuated by the exhaust device 41 through the exhaust pipe 39.

In addition, a cylindrical heating mechanism 42 configured to heat the processing container 1 and the wafers W inside the processing container 1 is provided to surround the outer periphery of the processing container 1.

Further, the processing apparatus 100 includes a controller 50. The controller 50 performs operation control of each part of the processing apparatus 100, for example, supply/stop control of each gas by opening/closing the opening/closing valves 21e, 22e, 23e, and 24e, gas flow rate control by the flow rate controllers 21d, 22d, 23d, and 24d, and exhaust control by the exhaust device 41. In addition, the controller 50 performs, for example, ON/OFF control of the high-frequency electric power by the high-frequency power supply 35, and temperature control of wafers W by the heating mechanism 42.

The controller 50 may be, for example, a computer or the like. In addition, a computer program that performs the operation of each part of the processing apparatus 100 is stored in a storage medium. The storage medium may be, for example, a flexible disc, a compact disc, a hard disk, a flash memory, a DVD, or the like.

As described above, the processing apparatus 100 includes a gas supply pipe 22 provided in the processing container 1 and configured to supply $H_2$ gas into the processing container 1, and a gas supply pipe 23 provided in the plasma generation space and configured to supply $H_2$ gas to the plasma generation space. As a result, hydrogen radicals can be generated within an area (hereinafter, referred to as a "wafer processing area") in which the wafers W are accommodated in the processing container 1, in addition to generating hydrogen radicals within the plasma generation space. Specifically, the $H_2$ gas supplied from the gas supply pipe 23 is converted into plasma in the plasma generation space so as to generate hydrogen radicals. The hydrogen radicals reach the wafers W in the processing container 1 through the opening 31. On the other hand, the $H_2$ gas supplied from the gas supply pipe 22 disposed near the wafers W is indirectly activated by the hydrogen radicals generated in the plasma generation space so as to generate hydrogen radicals. Therefore, it is possible to increase the amount of hydrogen radicals in the wafer processing area without increasing the high-frequency power for plasma generation. As a result, the amount of hydrogen radicals reaching the central portion of the wafer W increases, and the difference between the amount of hydrogen radicals reaching the peripheral edge portion of the wafer W and the amount of hydrogen radicals reaching the central portion of the wafer W is reduced. Thus, the in-plane uniformity of hydrogen radical processing is improved.

[Processing Method]

Figure 3:
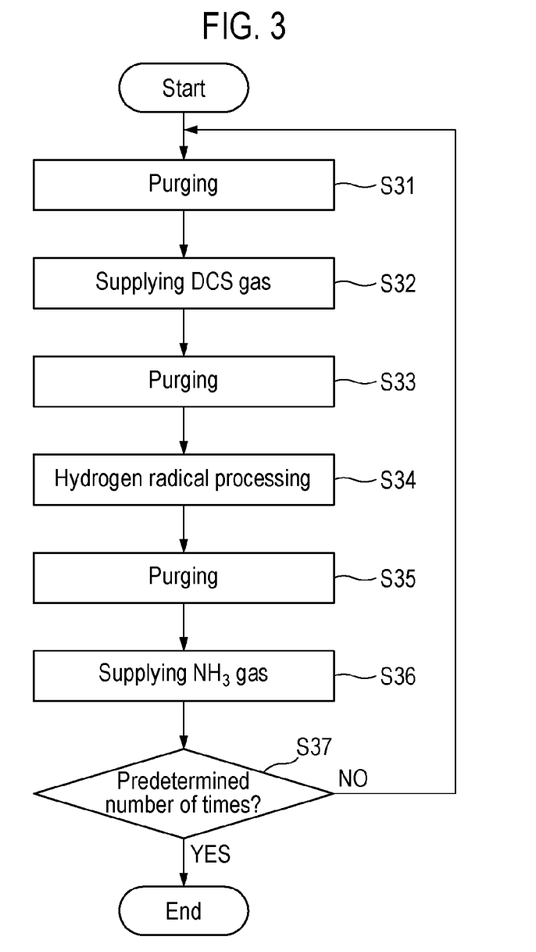
FIG. 3 is a flowchart illustrating an exemplary method for forming a SiN film according to an embodiment.

A processing method according to an embodiment will be described by taking as an example a case where a silicon nitride film (SiN film) is formed on wafers W by the processing apparatus 100 described above. FIG. 3 is a flowchart illustrating an exemplary method for forming a SiN film according to an embodiment.

First, the temperature inside the processing container 1 is adjusted to a predetermined temperature (e.g., 400 to 630 degrees C.), and the wafer boat 5 on which a large number of wafers W are placed is loaded into the processing container 1. Subsequently, the pressure inside the processing container 1 is regulated to a predetermined pressure (e.g., 13.3 to 666.6 Pa) while the inside of the processing container 1 is evacuated by the exhaust device 41.

Next, as illustrated in step S31, while the inside of the processing container 1 is evacuated by the exhaust device 41, $N_2$ gas is supplied as an inert gas into the processing container 1 from the gas supply pipe 24. As a result, the atmosphere in the processing container 1 is replaced with the $N_2$ gas. The processing conditions in step S31 are preferably as follows: $N_2$ gas flow rate of 200 to 10,000 sccm and time of 3 to 10 sec.

Subsequently, as illustrated in step S32, DCS gas is supplied as a raw material gas from the gas supply pipe 21 into the processing container 1 so that silicon (Si) is adsorbed to the surface of the wafer W. The processing conditions in step S32 are preferably as follows: DCS gas flow rate of 500 to 5,000 sccm and time of 3 to 10 sec.

Next, as illustrated in step S33, an inert gas is supplied into the processing container 1 from the gas supply pipe 24, and excess DCS gas supplied into the processing container 1 in step S32 is purged. The processing conditions in step S33 are preferably as follows: $N_2$ gas flow rate of 200 to 10,000 sccm and time of 3 to 10 sec.

Subsequently, as illustrated in step S34, while evacuating the processing container 1, $H_2$ gas is supplied from the gas supply pipe 23 to the plasma generation space, and the plasma generator 30 converts the $H_2$ gas into plasma so as to generate hydrogen radicals. Then, the generated hydrogen radicals are caused to act on the Si adsorbed in step S32. In addition, $H_2$ gas is supplied into the processing container 1 from the gas supply pipe 22. At this time, some or all of the $H_2$ gas supplied into the processing container 1 from the gas supply pipe 22 is converted into plasma in the processing container 1 so as to generate hydrogen radicals. As a result, the hydrogen radicals generated due to the $H_2$ gas supplied from the gas supply pipe 23 and the hydrogen radicals generated due to the $H_2$ gas supplied from the gas supply pipe 22 act on the Si adsorbed on the wafer W. Since the amount of hydrogen radicals in the wafer processing area increases as described above, the amount of hydrogen radicals reaching the center of the wafer W increases. Accordingly, the difference between the amounts of hydrogen radicals reaching the peripheral edge portion of the wafer W and the central portion of the wafer W becomes smaller. As a result, the in-plane uniformity of the hydrogen radical processing is improved. Preferably, the processing conditions in step S34 are as follows: high-frequency power of 50 to 250 W, $H_2$ gas flow rate of 500 to 4,000 sccm, and time of 5 to 120 sec.

One example of the effects of causing hydrogen radicals to act on adsorbed Si is as follows. When the DCS gas is supplied, impurities such as Cl and H contained in the DCS or excess Si are physically adsorbed to the chemically adsorbed Si in a cluster form. The SiN formed by supplying $NH_3$ gas in that state contains impurities such as Cl and H, excess Si clusters, or the like. Thus, Si—N bonds are not sufficiently formed in the SiN, and the SiN also contains pores. By the acts of the hydrogen radicals, it is possible to remove impurities such as Cl, H, and excess Si in the form of HCl, $SiH_4$, or the like. As a result, a substantially monoatomic layer Si is adsorbed. By supplying $NH_3$ gas in this state, it is possible to obtain the state in which the amount of impurities and pores is reduced and in which Si—N bonds are sufficiently formed.

Subsequently, as illustrated in step S35, an inert gas is supplied into the processing container 1 from the gas supply pipe 24, and excess $H_2$ gas supplied into the processing container 1 in step S34 is purged. Preferably, the processing conditions in step S35 are as follows: $N_2$ gas flow rate of 200 to 10,000 sccm and time of 3 to 10 sec.

Subsequently, as illustrated in step S36, NH₃ gas is supplied as a nitriding gas from the gas supply pipe 23 to the plasma generation space, the NH₃ gas is converted into plasma by the plasma generator 30 so as to generate active species for nitriding, and the Si absorbed in step S32 is nitrided. Preferably, the processing conditions in step S36 are as follows: NH₃ gas flow rate of 500 to 10,000 sccm and time of 10 to 60 sec.

Subsequently, as illustrated in step S37, it is determined whether or not steps S31 to S36 have reached a predetermined number of times. When the predetermined number of times has been reached, the processing is terminated, and when the predetermined number of times has not been reached, the processing returns to step S31.

As described above, in the method of forming a SiN film according to an embodiment, the SiN film having a desired film thickness is formed by repeating the adsorption of Si, the hydrogen radical processing, and the nitriding of Si in this order with purging interposed therebetween. In step S34, in addition to being supplied from the gas supply pipe 23 provided in the plasma generation space, $H_2$ gas is also supplied from the gas supply pipe 22 provided in the processing container 1. As a result, since it is possible to supply a larger amount of hydrogen radicals to the adsorbed Si than that in the related art, the amount of hydrogen radicals reaching the central portion of the wafer W increases, and thus the difference between the amount of hydrogen radicals reaching the peripheral edge portion of the wafer W and the amount of hydrogen radicals reaching the central portion of the wafer W becomes smaller. As a result, the in-plane uniformity of the hydrogen radical processing is improved.

Figure 4:
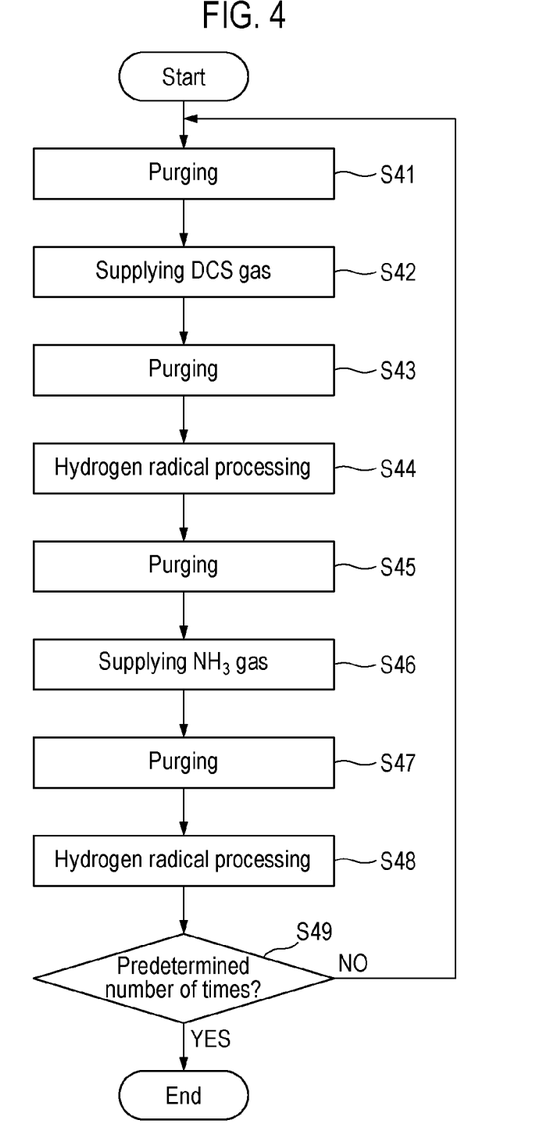
FIG. 4 is a flowchart illustrating another exemplary method for forming a SiN film according to an embodiment.

Next, another exemplary method of forming a SiN film on a wafer W by the above-described processing apparatus 100 will be described. FIG. 4 is a flowchart illustrating another exemplary method for forming a SiN film according to an embodiment.

The example illustrated in FIG. 4 differs from the example illustrated in FIG. 3 in that hydrogen radical processing is additionally performed after the step of supplying the NH₃ gas as a nitriding gas so as to nitride Si, and before the step of supplying the DCS gas as a raw material gas so as to adsorb Si.

First, the temperature in the processing container 1 is adjusted to a predetermined temperature (e.g., 400 to 630 degrees C.), and the wafer boat 5 on which a large number of wafers W are placed is loaded into the processing container 1. Subsequently, the pressure inside the processing container 1 is regulated to a predetermined pressure (e.g., 13.3 to 666.6 Pa) while the inside of the processing container 1 is evacuated by the exhaust device 41.

Subsequently, steps S41 to S46 are performed. Steps S41 to S46 are the same as steps S31 to S36 in the method for forming a SiN film illustrated in FIG. 3.

Next, as illustrated in step S47, an inert gas is supplied into the processing container 1 from the gas supply pipe 24, and excess NH₃ gas supplied into the processing container 1 in step S46 is purged. Preferably, the processing conditions in step S47 are as follows: N₂ gas flow rate of 200 to 10,000 sccm and time of 3 to 10 sec.

Subsequently, as illustrated in step S48, while evacuating the processing container 1, $H_2$ gas is supplied from the gas supply pipe 23 to the plasma generation space, and the plasma generator 30 converts the $H_2$ gas into plasma so as to generate hydrogen radicals. Then, the generated hydrogen radicals are caused to act on the Si nitrided in step S46. In addition, $H_2$ gas is supplied into the processing container 1 from the gas supply pipe 22. At this time, some or all of the $H_2$ gas supplied into the processing container 1 from the gas supply pipe 22 is converted into plasma in the processing container 1 so as to generate hydrogen radicals. As a result, the hydrogen radicals generated due to the $H_2$ gas supplied from the gas supply pipe 23 and the hydrogen radicals generated due to the $H_2$ gas supplied from the gas supply pipe 22 act on the nitrided Si that is adsorbed on the wafer W. Since the amount of hydrogen radicals in the wafer processing area increases as described above and thus the amount of hydrogen radicals reaching the center of the wafer W increases, the difference between the amount of hydrogen radicals reaching the peripheral edge portion of the wafer W and the central portion of the wafer W becomes smaller. As a result, the in-plane uniformity of hydrogen radical processing is improved. Preferably, the processing conditions in step S48 are as follows: high-frequency power of 50 to 250 W, $H_2$ gas flow rate of 500 to 4000 sccm, and time of 5 to 120 sec.

The effects of causing the hydrogen radicals to act on the nitrided Si are as follows. In some cases, Cl and H, which are impurities that were not removed in the hydrogen radical processing in step S44, and physically adsorbed excess Si clusters remain without being nitrided. When DCS gas is supplied in this state to cover a portion where Si—N bonds are not sufficient, the formed SiN becomes a film having insufficient Si—N bonds. By the acts of the hydrogen radicals, it is possible to remove impurities such as Cl, H, and excess Si in the form of HCl, $SiH_4$, or the like. As a result, it is possible to obtain a state in which impurities and pores are small and Si—N bonds are sufficiently formed.

Subsequently, as illustrated in step S49, it is determined whether or not steps S41 to S48 have reached a predetermined number of times. When the predetermined number of times has been reached, the processing is terminated, and when the predetermined number of times has not been reached, the processing returns to step S41.

As described above, in the method of forming a SiN film according to an embodiment, the SiN film having a desired film thickness is formed by repeating the adsorption of Si, the hydrogen radical processing, the nitriding of Si, and the hydrogen radical processing in this order with purging interposed therebetween. In step S44 and step S48, in addition to being supplied from the gas supply pipe 23 provided in the plasma generation space, $H_2$ gas is also supplied from the gas supply pipe 22 provided in the processing container 1. As a result, since it is possible to supply a larger amount of hydrogen radicals to the adsorbed Si than that in the related art, the amount of hydrogen radicals reaching the central portion of the wafer W increases, and thus the difference between the amount of hydrogen radicals reaching the peripheral edge portion of the wafer W and the amount of hydrogen radicals reaching the central portion of the wafer W becomes smaller. As a result, the in-plane uniformity of the hydrogen radical processing is improved.

Example

Next, examples performed to confirm the effects of the processing method of the embodiment will be described.

In Example 1, SiN films were formed on wafers W having a diameter of 300 mm by the method of forming a SiN film illustrated in FIG. 3 using the processing apparatus 100 described above. In Example 1, $H_2$ gas was supplied from the gas supply pipe 22 and the gas supply pipe 23 during hydrogen radical processing. The supply time of $H_2$ gas per cycle (the time of hydrogen radical processing) was adjusted to 30 sec, 60 sec, and 120 sec. Further, the film stress of each of the formed SiN films was measured. In addition, the in-plane wet etching rate of the SiN films formed by adjusting the hydrogen radical processing time to 60 sec was measured.

For comparison with Example 1, SiN films were formed on wafers W under the same processing conditions as Example 1, except that the hydrogen radical processing was performed by supplying $H_2$ gas only from the gas supply pipe 23 during the hydrogen radical processing (Comparative Example 1). Further, the film stress of each of the formed SiN films was measured. In addition, the in-plane wet etching rate of the SiN films formed by adjusting the hydrogen radical processing time to 60 sec was measured.

Figure 5:
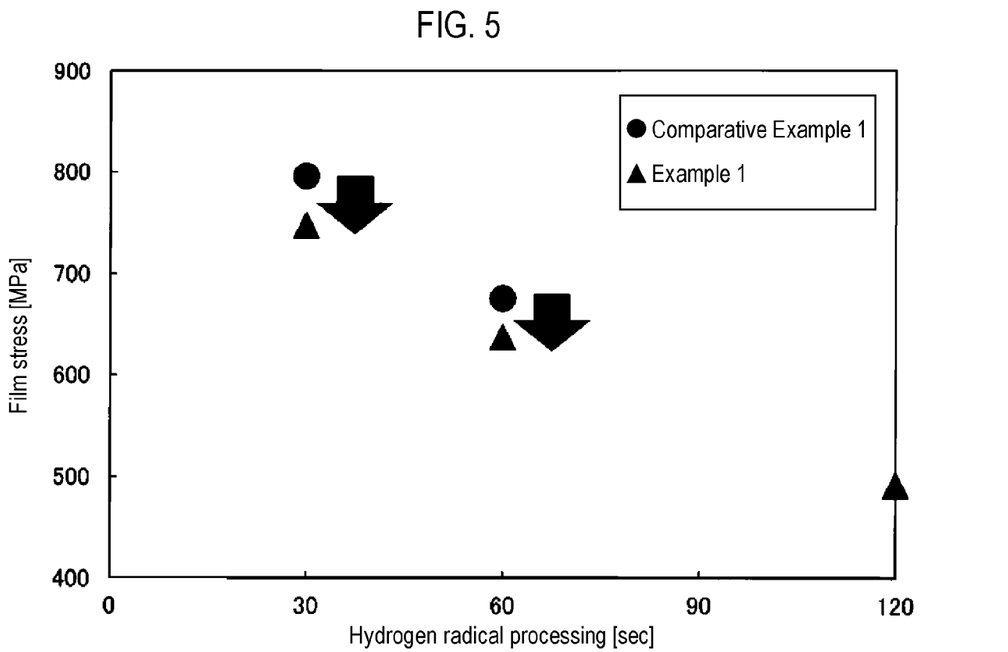
FIG. 5 is a view illustrating a relationship between a hydrogen radical processing time and film stress.

FIG. 5 is a diagram illustrating a relationship between a hydrogen radical processing time and film stress. In FIG. 5, the horizontal axis indicates the hydrogen radical processing time [sec] per cycle, and the vertical axis indicates the film stress [MPa]. In FIG. 5, triangle (▲) marks indicate measurement results of Example 1, and circle (●) marks indicate measurement results of Comparative Example 1.

As illustrated in FIG. 5, it can be seen that the longer the hydrogen radical processing time per cycle, the lower the film stress of the SiN film. In addition, when the hydrogen radical processing times per cycle are the same, it can be seen that the SiN film of Example 1 has a film stress lower than that of the SiN film of Comparative Example 1. That is, it can be said that by supplying $H_2$ gas from the gas supply pipe 22 provided in the processing container 1 as well in addition to supplying $H_2$ gas from the gas supply pipe 23 provided in the plasma generation space during the hydrogen radical processing, it is possible to efficiently reduce the film stress of a SiN film. That is, it is possible to form a film having a desired film stress in a short period of time. In order to change the film stress, it is necessary to change the film state of the entire surface of a wafer W. It is believed that the above result is obtained because the amount of hydrogen radicals reaching the central portion of the wafer W is particularly increased by supplying $H_2$ gas from the gas supply pipe 22 provided in the processing container 1 in addition to supplying $H_2$ gas from the gas supply pipe 23 provided in the plasma generation space.

Figure 6:
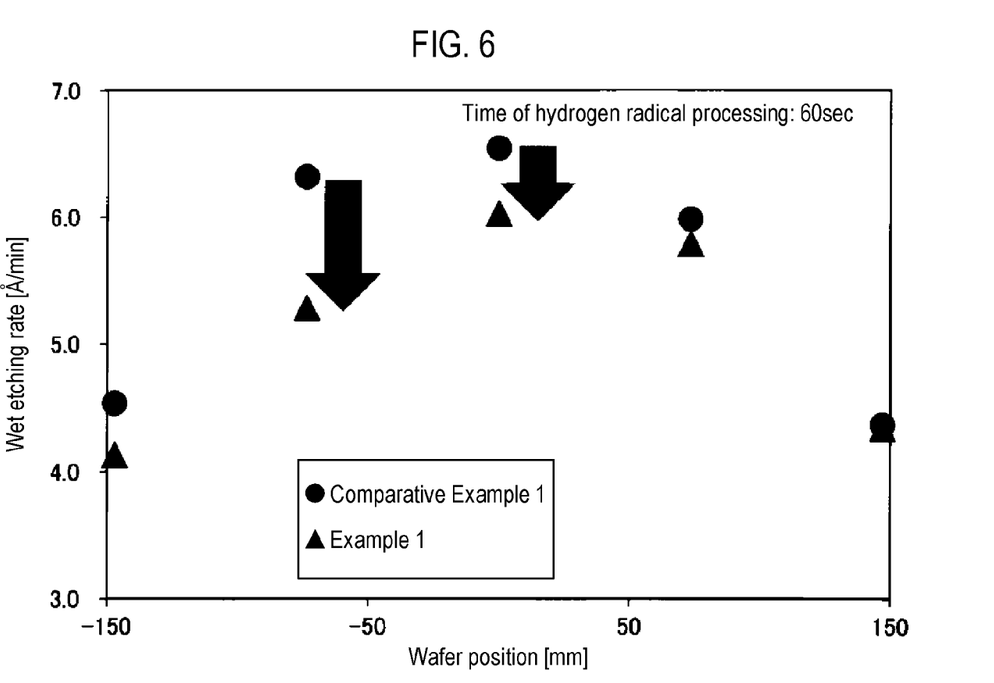
FIG. 6 is a view illustrating a relationship between a wafer position and a wet etching rate when hydrogen radical processing is performed.

FIG. 6 is a view illustrating a relationship between a wafer position and a wet etching rate when hydrogen radical processing is performed. In FIG. 6, the horizontal axis indicates a wafer position [mm], and the vertical axis indicates a wet etching rate [Å/min]. In FIG. 6, triangle (▲) marks indicate measurement results of Example 1, and circle (●) marks indicate measurement results of Comparative Example 1. The wafer position of 0 mm indicates the center of a wafer, and the wafer positions of −150 mm and +150 mm indicate wafer edges.

As illustrated in FIG. 6, it can be seen that the SiN films of Example 1 have a lower wet etching rate than the SiN films of Comparative Example 1 at any wafer position. From this, it can be said that it is possible to form a dense SiN film by supplying $H_2$ gas from the gas supply pipe 22 provided in the processing container 1 as well, in addition to supplying $H_2$ gas from the gas supply pipe 23 provided in the plasma generation space during the hydrogen radical processing.

In addition, in the central portions of wafers W (e.g., the wafer positions of −75 mm and 0 mm), the rate of decrease in the wet etching rates of the SiN films of Example 1 with respect to the SiN films of Comparative Example 1 is large compared to the peripheral edge portions of wafers W (e.g., the wafer positions of −150 mm and 150 mm). From this, it is considered that during the hydrogen radical processing, the amounts of hydrogen radicals reaching the central portions of the wafers W were particularly increased by supplying $H_2$ gas from the gas supply pipe 22 provided in the processing container 1, in addition to supplying $H_2$ gas from the gas supply pipe 23 provided in the plasma generation space.

Further, when the in-plane uniformity of the hydrogen radical processing is improved, the following effects are obtained.

In the case where a SiN film is formed by the ALD method, when the DCS gas is supplied in step S32, the DCS gas is adsorbed to an underlying chemical adsorption site in principle. However, when a saturated adsorption amount is reached, additional DCS gas is not adsorbed. Therefore, a monoatomic layer of Si is chemically adsorbed.

However, in the conventional ALD method, in practice, impurities such as Cl contained in the DCS gas are physically adsorbed and aggregated, and Si is also physically adsorbed and aggregated through the impurities, thereby forming Si clusters. Thus, excess Si adsorption occurs.

In this case, when a wafer surface is flat and thus the surface area is small, impurities are easily adsorbed and thus the amount of excess adsorption of Si increases. In contrast, when a wafer surface has many irregularities and thus the surface area is large, impurities are unlikely to reach the bottom of the recess portions and thus the amount of excess adsorption of Si decreases. This causes a loading effect in which a film forming amount fluctuates due to the difference in the surface state of the wafer. In addition, due to such excess adsorption of Si, a change in the thickness of a SiN film due to a change in the number of wafers W that are loaded is likely to occur.

In order to suppress such a loading effect, removal of impurities such as Cl that are physically adsorbed on the saturated Si and excess Si is required.

Therefore, in an embodiment, in forming a SiN film by the ALD method, after the step of supplying the DCS gas (step S32), the hydrogen radical processing (step S34) is performed so as to remove impurities physically adsorbed in step S32 and excess Si. At this time, in addition to being supplied from the gas supply pipe 23 provided in the plasma generation space, $H_2$ gas is also supplied from the gas supply pipe 22 provided in the processing container 1. Therefore, it is possible to supply a larger amount of hydrogen radicals to the Si adsorbed on the surface of a wafer W than before. As a result, it is possible to remove impurities physically adsorbed in step S32 and excess Si with good in-plane uniformity.

Specifically, when the DCS gas is used, impurities such as Cl and excess Si are physically adsorbed on a chemically adsorbed monoatomic layer of Si in a cluster form. By causing hydrogen radicals to act thereon, it is possible to remove the impurities such as physically adsorbed Cl and Si. Ideally, only the chemically adsorbed monoatomic layer of Si is left.

This allows the Si layer to approach the monoatomic layer state irrespective of the surface state of a wafer W, and thus it is possible to suppress variations in film thickness of the finally formed SiN film according to the surface state of a wafer W, that is, the loading effect.

In the above embodiment, the gas supply pipe 23 is an example of a first gas supply, and the gas supply pipe 22 is an example of a second gas supply.

In the above embodiment, the case where a silicon nitride film (SiN film) is formed has been described as an example, but the film to be formed may be a nitride film, and is not limited to the silicon nitride film. The technology of the present disclosure is also applicable to, for example, a titanium nitride film, a boron nitride film, a tungsten nitride film, an aluminum nitride film, and the like. In the case of forming a titanium nitride film, for example, a $TiCl_4$ gas is used as a raw material gas. When a boron nitride film is formed, for example, a $BCl_3$ gas is used as a raw material gas. When a tungsten nitride film is formed, for example, a $WCl_6$ gas is used as a raw material gas. When forming an aluminum nitride film, for example, an $AlCl_3$ gas is used as a raw material gas.

In addition, a nitride film may contain one or more of oxygen, carbon, boron, and fluorine. For example, upon taking a silicon nitride film as an example, the silicon nitride film may be SiON, SiCN, SiOCN, SiBN, SiBCN, SiBOCN, SiFN, or SiCFN, besides SiN. One or more elements selected from oxygen, carbon, boron, and fluorine are incorporated into a Si-containing layer in an adsorption step, a hydrogen radical generation step, a nitriding step, or a newly provided step. The incorporation process may be performed during the cycle of forming a nitride film.

In the above-described embodiment, the case where the substrate is a semiconductor wafer has been described as an example, but the present disclosure is not limited thereto. For example, the substrate may be a large substrate for a flat panel display (FPD), or a substrate for an EL element or a solar cell.

According to the present disclosure, it is possible to increase the amount of hydrogen radicals in a substrate processing area.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing method comprising:
   generating hydrogen radicals by supplying a hydrogen gas from a hydrogen gas supply pipe provided in a processing container accommodating a substrate therein into the processing container while supplying a hydrogen gas from a hydrogen gas supply pipe provided in a plasma generation space in communication with an inside of the processing container, into the plasma generation space, in order to increase an amount of the hydrogen radicals reaching a center of the substrate;
   adsorbing a gas containing a film forming raw material to the substrate by supplying the gas containing the film forming raw material into the processing container; and
   nitriding the film forming raw material adsorbed on the substrate by supplying a nitriding gas into the processing container.

2. The processing method of claim 1, wherein the generating the hydrogen radicals, the adsorbing the gas, and the nitriding the film forming raw material are repeated.

3. The processing method of claim 1, wherein the generating the hydrogen radicals is performed after the nitriding the film forming raw material and before the adsorbing the gas.

4. The processing method of claim 1, wherein the generating the hydrogen radicals is performed after the adsorbing the gas and before the nitriding the film forming raw material.

5. The processing method of claim 4, wherein the generating the hydrogen radicals is performed after the nitriding the film forming raw material and before the adsorbing the gas.

* * * * *